United States Patent
Huang et al.

(10) Patent No.: US 10,402,523 B2
(45) Date of Patent: Sep. 3, 2019

(54) SYSTEM FOR MONITORING ELECTRONIC CIRCUIT AND METHOD FOR MONITORING ELECTRONIC CIRCUIT

(71) Applicant: Industrial Technology Research Institute, Hsinchu (TW)

(72) Inventors: Shi-Yu Huang, Taoyuan (TW); Hua-Cheng Fu, Taoyuan (TW); Hua-Xuan Li, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 668 days.

(21) Appl. No.: 14/983,571

(22) Filed: Dec. 30, 2015

(65) Prior Publication Data
US 2017/0038430 A1 Feb. 9, 2017

Related U.S. Application Data

(60) Provisional application No. 62/200,657, filed on Aug. 4, 2015.

(30) Foreign Application Priority Data

Nov. 11, 2015 (TW) .............................. 104137170 A

(51) Int. Cl.
*G06F 17/50* (2006.01)
*G01R 31/28* (2006.01)
(Continued)

(52) U.S. Cl.
CPC ..... *G06F 17/5036* (2013.01); *G01R 31/2856* (2013.01); *G01R 31/3004* (2013.01); *H03K 5/19* (2013.01); *H03K 3/0315* (2013.01)

(58) Field of Classification Search
CPC .... G06F 17/5036; H03K 5/19; H03K 3/0315; G01R 31/3004; G01R 31/2856
(Continued)

(56) References Cited

U.S. PATENT DOCUMENTS 6,559,667 B1 5/2003 Tarter
6,882,238 B2 4/2005 Kurd et al.
(Continued)

FOREIGN PATENT DOCUMENTS

CN 1545622 11/2004
CN 101192825 6/2008
(Continued)

OTHER PUBLICATIONS

Hsu et al., "Worst-case IR-drop monitoring with 1GHz sampling rate," International Symposium on VLSI Design, Automation, and Test (VLSI-DAT), Apr. 22-24, 2013, pp. 1-4.
(Continued)

*Primary Examiner* — Saif A Alhija
(74) *Attorney, Agent, or Firm* — JCIPRNET

(57) ABSTRACT

A system for monitoring electronic circuit configured to monitor circuit parameters of an electronic circuit is provided. The system for monitoring electronic circuit includes an observing point monitoring circuit, a system control circuit, and a signal measuring circuit. The observing point monitoring circuit includes a plurality of sensor circuits arranged in an array. The sensor circuits respectively sense the circuit parameters of a plurality of observing points in the electronic circuit. The system control circuit selects at least one of the sensor circuits to sense the circuit parameters. One of the selected sensor circuits outputs a sensing signal. The signal measuring circuit receives the sensing signal and analyzes an electrical characteristic of the sensing signal to obtain a monitoring result of the circuit parameters. A method for monitoring electronic circuit is also provided.

29 Claims, 12 Drawing Sheets

(51) Int. Cl.
    *G01R 31/30*    (2006.01)
    *H03K 5/19*     (2006.01)
    *H03K 3/03*     (2006.01)

(58) Field of Classification Search
    USPC .......................................................... 703/14
    See application file for complete search history.

(56) References Cited

U.S. PATENT DOCUMENTS

| | | | |
|---|---|---|---|
| 7,047,746 | B2 | 5/2006 | Hellat |
| 7,581,881 | B2 | 9/2009 | Kim et al. |
| 7,891,868 | B2 | 2/2011 | Sohn |
| 8,217,671 | B2 | 7/2012 | Agarwal et al. |
| 8,277,120 | B2 | 10/2012 | Ishii |
| 8,384,417 | B2 | 2/2013 | Laisne et al. |
| 8,419,274 | B2 | 4/2013 | Chen et al. |
| 2014/0225639 | A1 | 8/2014 | Guo et al. |

FOREIGN PATENT DOCUMENTS

| | | |
|---|---|---|
| CN | 101022107 | 10/2012 |
| CN | 102760639 | 10/2012 |
| CN | 103091619 | 5/2013 |
| CN | 103263922 | 8/2013 |
| EP | 1272860 | 1/2003 |
| KR | 100608412 | 8/2006 |
| KR | 20090099536 | 9/2009 |
| KR | 20130021313 | 3/2013 |
| KR | 20130091670 | 8/2013 |
| TW | 201109677 | 3/2011 |
| TW | 201118516 | 6/2011 |
| TW | 201226920 | 7/2012 |
| TW | I387736 | 3/2013 |
| TW | 201319591 | 5/2013 |
| TW | 201341813 | 10/2013 |
| TW | I458367 | 10/2014 |

OTHER PUBLICATIONS

Huang et al., "On-Line Transition-Time Monitoring for Die-to-Die Interconnects in 3D ICs," IEEE 23rd Asian Test Symposium (ATS), Nov. 16-19, 2014, pp. 162-167.
Li et al., "Testing power-delivery TSVs," 6th Asia Symposium on Quality Electronic Design (ASQED), Aug. 4-5, 2015, pp. 127-131.
"Office Action of Taiwan Counterpart Application," dated Sep. 18, 2017, p. 1-p. 3, in which the listed references were cited.
"Notice of allowance of Korea Counterpart Application", dated Jul. 5, 2017,with English translation thereof, p. 1-p. 4, in which the listed references were cited.
"Notice of allowance of Taiwan Counterpart Application", dated Aug. 24, 2016, p. 1-p. 5, in which the listed references were cited.
"Office Action of Korea Counterpart Application" with English translation, dated Oct. 18, 2016, p. 1-p. 9, in which the listed references were cited.
"Office Action of China Counterpart Application" , dated Aug. 30, 2018, p. 1-p. 9.

SYSTEM FOR MONITORING ELECTRONIC CIRCUIT AND METHOD FOR MONITORING ELECTRONIC CIRCUIT

CROSS-REFERENCE TO RELATED APPLICATION

This application claims the priority benefits of U.S. provisional application Ser. No. 62/200,657, filed on Aug. 4, 2015 and Taiwan application serial no. 104137170, filed on Nov. 11, 2015. The entirety of each of the above-mentioned patent applications is hereby incorporated by reference herein and made a part of this specification.

TECHNICAL FIELD

The disclosure relates to a system for monitoring electronic circuit and a method for monitoring electronic circuit.

BACKGROUND

Performance and reliability of an electronic circuit are closely related to a power voltage drop in a power network. Accordingly, a large number of on-line power voltage drop sensors have been utilized in existing technologies for verifying the power network inside the electronic circuit and providing the verified information when the electronic circuit is unable to operate normally. In the existing technologies, some of the on-line power voltage drop sensors provide only static power voltage drop information (i.e., an average power voltage drop within a long period of time) while the others are capable of dynamically tracking the conditions of the power voltage drop in real time. However, because a clock period of the electronic circuit is relatively shorter in the electronic circuit with higher working frequency, errors are likely to occur on overall circuit operations due to unexpected sudden power surges.

Besides, for an advanced process as well as in a 3D electronic circuit, with the electronic circuit being manufactured to be smaller each day, circuit elements and transmitters are also arranged more densely. As such, it has also become an important issue as how to monitor a heat dissipation during operations of the electronic circuit and determine whether overheat occurs. Further, the 3D electronic circuit may include hundreds of through-silicon vias for transferring power. If these through-silicon vias for transferring power are damaged during the manufacturing process, a quality of power supplied to the internal circuits may be directly affected, thereby influencing overall performance and reliability of the electronic circuit.

SUMMARY

The disclosure is directed to a system for monitoring electronic circuit and a method for monitoring electronic circuit, which are configured to monitor one or more circuit parameters of an electronic circuit, so as to improve performance and reliability of the electronic circuit.

A system for monitoring electronic circuit of the disclosure is configured to monitor one or more circuit parameters of an electronic circuit. The system for monitoring electronic circuit includes an observing point monitoring circuit, a system control circuit, and a signal measuring circuit. The observing point monitoring circuit includes a plurality of sensor circuits arranged in an array. The sensor circuits are configured to respectively sense the circuit parameters of a plurality of observing points in the electronic circuit. The system control circuit is coupled to the observing point monitoring circuit. The system control circuit is configured to select at least one of the sensor circuits to sense the circuit parameters. One of the selected sensor circuits outputs a sensing signal. The signal measuring circuit is coupled to the observing point monitoring circuit. The signal measuring circuit is configured to receive the sensing signal and analyze an electrical characteristic of the sensing signal to obtain a monitoring result of the circuit parameters.

A method for monitoring electronic circuit of the disclosure is configured to monitor one or more circuit parameters of an electronic circuit. The method for monitoring electronic circuit includes: respectively sensing the circuit parameters of a plurality of observing points in the electronic circuit by using a plurality of sensor circuits arranged in an array; selecting at least one of the sensor circuits to sense the circuit parameters; and analyzing an electrical characteristic of the sensing signal outputted by the selected sensor circuits to obtain a monitoring result of the circuit parameters.

Based on the above, in the exemplary embodiments of the disclosure, the system and the method for monitoring electronic circuit uses the sensor circuits arranged in the array to sense the circuit parameters and analyzes the electrical characteristic of the sensing signal to obtain the monitoring result of the circuit parameters, so as to improve performance and reliability of the electronic circuit.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
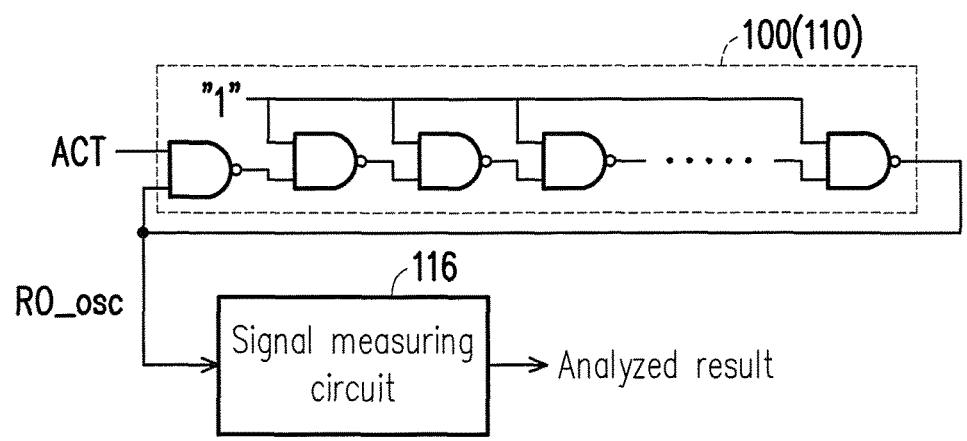
FIG. 1 is a schematic diagram illustrating a sensor circuit and a signal measuring circuit in one exemplary embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The term "coupling/coupled" used in this specification (including claims) of the disclosure may refer to any direct or indirect connection means. For example, "a first device is coupled to a second device" should be interpreted as "the first device is directly connected to the second device" or "the first device is indirectly connected to the second device through other devices or connection means." In addition, the term "signal" can refer to a current, a voltage, a charge, a temperature, data, electromagnetic wave or any one or multiple signals.

The disclosure is directed to a system for monitoring electronic circuit and a method for monitoring electronic circuit, which are configured to monitor one or more circuit parameters of an electronic circuit. Said circuit parameters includes (but not limited to) a power voltage, an operating temperature and a process variation, for example. In the method for monitoring electronic circuit of the disclosure, a large amount of sensor circuits is implanted in an electronic circuit (e.g., a wafer) and an electrical characteristic of a sensing signal is quantified by a signal measuring circuit. Next, the method for monitoring electronic circuit of the disclosure eliminates the factor of the process variation for the quantified electrical characteristic by analysis of a 3D model, and estimates the corresponding power voltage and operating temperature according to the monitored electrical characteristic, so as to monitor the power voltage and the operating temperature in an operating period of the electronic circuit. Embodiments are provided below to describe the disclosure, but the disclosure is not limited to the provided embodiments, and the provided embodiments can be suitably combined.

Figure 2:
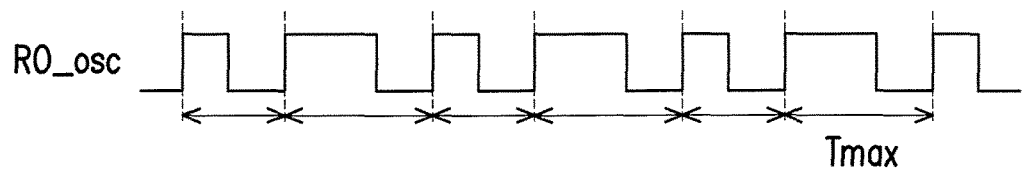
FIG. 2 illustrates a signal waveform diagram of the sensing signal in the embodiment of FIG. 1.

FIG. 1 is a schematic diagram illustrating a sensor circuit and a signal measuring circuit in one exemplary embodiment of the disclosure. FIG. 2 illustrates a signal waveform diagram of the sensing signal in the embodiment of FIG. 1. Referring to FIG. 1 and FIG. 2 together, a sensor circuit 100 of the present exemplary embodiment includes a ring oscillator 110. Signal periods oscillated from a monitoring period of the system by the ring oscillator 110 will be changed according to current parameters of an electronic circuit. For example, an oscillation signal RO_osc outputted by the ring oscillator 110 is used as a sensing signal having an oscillation period that becomes greater or smaller according to a power voltage, an oscillation signal or a process variation. In the present exemplary embodiment, a signal measuring circuit 116 analyzes the oscillation period of the oscillation signal RO_osc to obtain a monitoring result of the circuit parameters.

In the present exemplary embodiment, the signal measuring circuit 116 records a maximum oscillation period Tmax of the oscillation signal RO_osc in the monitoring period, and converts the maximum oscillation period into a digital code as an analyzed result to be outputted. Therefore, the digital code includes a message of a maximum power voltage drop sensed in the monitoring period by the sensor circuit 100. Other than that, in the present exemplary embodiment, the signal measuring circuit 116 also records information regarding an average oscillation period of the oscillation signal RO_osc, and converts said information into another digital code to be outputted. Therefore, in the present exemplary embodiment, the analyzed result of the oscillation period includes at least one of the maximum oscillation period and the average oscillation period of the oscillation signal RO_osc. The system for monitoring electronic circuit will simultaneously display the message of an average value and a maximal value of the oscillation period in the monitoring period.

In the present exemplary embodiment, the ring oscillator 110 is, for example, an oscillator including a plurality of NAND gates connected in series, but the disclosure is not limited thereto. In one exemplary embodiment, the sensor circuit 100 may also use an oscillator of other types to serve as the sensor. Furthermore, in the present exemplary embodiment, a target analyzed by the signal measuring circuit 116 is the oscillation period of the oscillation signal RO_osc, but the disclosure is not limited thereto. In one exemplary embodiment, what analyzed by the signal measuring circuit 116 may also be an electrical characteristic of the sensing signal in other types, which are not particularly limited by the disclosure.

Figure 3:
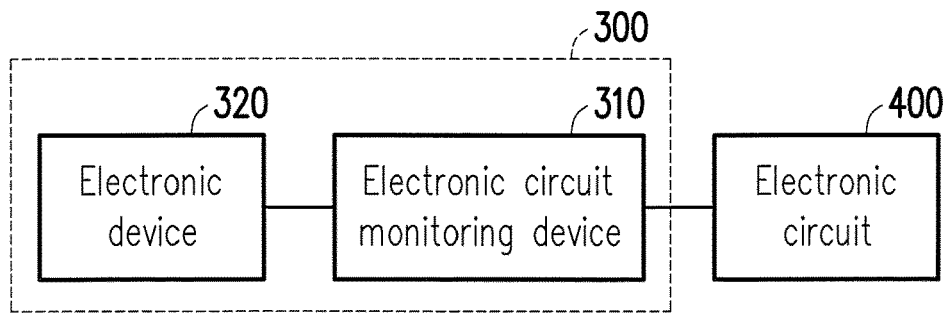
FIG. 3 is a schematic block diagram illustrating a system for monitoring electronic circuit in one exemplary embodiment of the disclosure.
Figure 4:
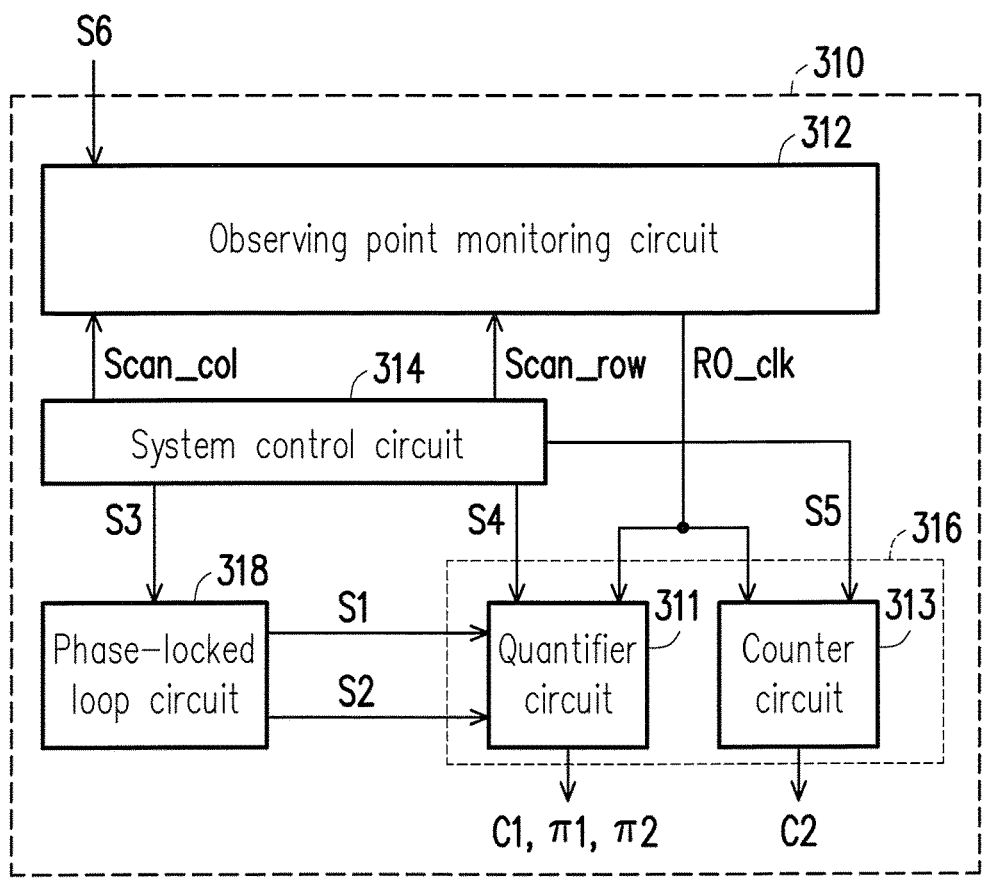
FIG. 4 illustrates a schematic diagram of the electronic circuit monitoring device in the embodiment of FIG. 3.
Figure 5:
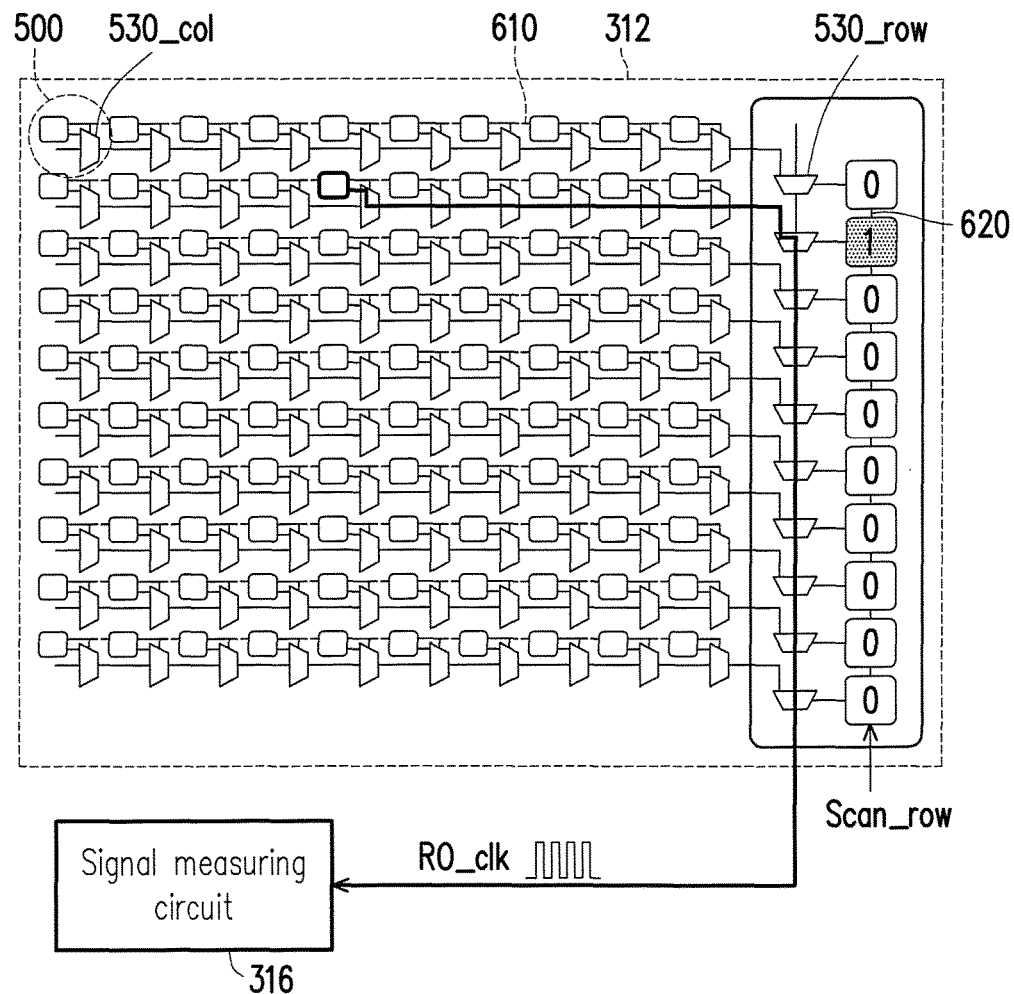
FIG. 5 illustrates a schematic circuit diagram of the observing point monitoring circuit in the embodiment of FIG. 3.

FIG. 3 is a schematic block diagram illustrating a system for monitoring electronic circuit in one exemplary embodiment of the disclosure. FIG. 4 illustrates a schematic diagram of the electronic circuit monitoring device in the embodiment of FIG. 3. FIG. 5 illustrates a schematic circuit diagram of the observing point monitoring circuit in the embodiment of FIG. 3. Referring to FIG. 3 to FIG. 5, a system 300 for monitoring electronic circuit is configured to monitor one or more circuit parameters of an electronic circuit 400. Said circuit parameters includes (but not limited to) a power voltage, an operating temperature and a process variation, for example. In the present exemplary embodiment, the system 300 for monitoring electronic circuit includes an electronic circuit monitoring device 310 and an electronic device 320. The electronic circuit monitoring device 310 includes an observing point monitoring circuit 312, a system control circuit 314, a signal measuring circuit 316 and a phase-locked loop circuit 318.

In the present exemplary embodiment, the observing point monitoring circuit 312 is configured to use a plurality of sensor circuits 500 to respectively sense the one or more circuit parameters of each of observing points in the electronic circuit 400. The system control circuit 314 is configured to select at least one of the sensor circuits 500 to sense the circuit parameters of the corresponding observing point. In one exemplary embodiment, the system control circuit 314 selects one of the sensor circuits 500 to sense the circuit parameters of the corresponding observing point, for example. In this example, the selected sensor circuit 500 outputs a sensing signal RO_clk. In one exemplary embodiment, the system control circuit 314 may also select more of the sensor circuits 500 to sense the circuit parameters of the corresponding observing point. In this example, one of the selected sensor circuits 500 outputs the sensing signal RO_clk. The signal measuring circuit 316 is configured to receive the sensing signal RO_clk outputted by the sensor circuit 500 and analyze an electrical characteristic of the sensing signal RO_clk to output the analyzed result to the electronic device 320. Next, the electronic device 320 obtains the monitoring result of the circuit parameters according to the analyzed result of the electrical characteristic. In the present exemplary embodiment, the monitoring result of the circuit parameters includes the maximum power voltage drop, the operating temperature and the process variation obtained while monitoring the electronic circuit 400, but the disclosure is not limited thereto.

Referring to FIG. 5, in the present exemplary embodiment, the observing point monitoring circuit 312 includes the sensor circuits 500 arranged in an array. The sensor circuits 500 are implanted inside the electronic circuit 400 to respectively sense the circuit parameters in each of the observing points. In the present exemplary embodiment, the system control circuit 314 outputs a first scan signal Scan_row to the observing point monitoring circuit 312 to select a row of the sensor circuits 500 from the array to sense the one or more circuit parameters. The sensing signal RO_clk is outputted from the selected row. The system control circuit 314 further outputs a second scan signal Scan_col to the observing point monitoring circuit 312 to select one sensor circuit from the selected row to sense the one or more circuit parameters of the corresponding observing point. The system control circuit 314 outputs the first scan signal Scan_row and the second scan signal Scan_col to the observing point monitoring circuit 312, separately, so as to select one of the sensor circuits 500 to sense the circuit parameters. For instance, the system control circuit 314 first utilizes the first scan signal Scan_row to select one row from the array, and then utilizes the second scan signal Scan_col to select one sensor circuit 500 from the selected row to sense the circuit parameters of the corresponding observing point. In the present exemplary embodiment, the system control circuit 314 can randomly or sequentially select any one sensor circuit 500 from the array for sensing, which is not particularly limited by the disclosure.

Therefore, in the present exemplary embodiment, the observing point monitoring circuit 312 connects the sensor circuits 500 in the array in series by using a two-level scan chain formed by selector circuits 530_col and 530_row. The sensor circuits 500 are distributed in form of a 2D array. The system circuit 314 utilizes scan chains 610 and 620 in different directions to select the sensor circuit 500 in the 2D array for monitoring, and transmits the sensing signal RO_clk to the signal measuring circuit 316. In the present exemplary embodiment, the scan chain 610 in a row direction connects register circuits (e.g., a register circuit 520 in FIG. 6) in the sensor circuits 500 of the same row together. In the monitoring period, a value of one register circuit in the sensor circuits 500 of the same row is maintained at a digital value "1", and one corresponding to such register circuit is the sensor circuit 500 currently selected for sensing. Each time when a monitoring position scans to a last column position in one of the rows, the digital value "1" of the scan chain 610 is transferred to a first column position of a next row in a next monitoring period. Further, the other scan chain 620 is a column position scan chain for controlling selection of one for transferring the sensing signal RO_clk to the signal measuring circuit 316. Each time when the monitoring position scans to the last column position of one of the rows, the scan chain 620 starts to scan for once. That is to say, an original horizon transmission path will be closed, and a next horizon transmission path will be opened for transferring the sensing signal RO_clk to the signal measuring circuit 316. For instance, in FIG. 5, when the monitoring position scans to the last column position of a first row, the scan chain 620 starts to scan for once. Accordingly, the horizon transmission path of the first row is closed, and the horizon transmission path of a second row is opened for transferring the sensing signal RO_clk to the signal measuring circuit 316. Therefore, in this example, the selector circuit 530_row connected to a second row has as a selection signal marked with the digital value "1" which indicates that the horizontal transmission path of the second row is opened for transferring the sensing signal RO_clk to the signal measuring circuit 316.

Figure 6:
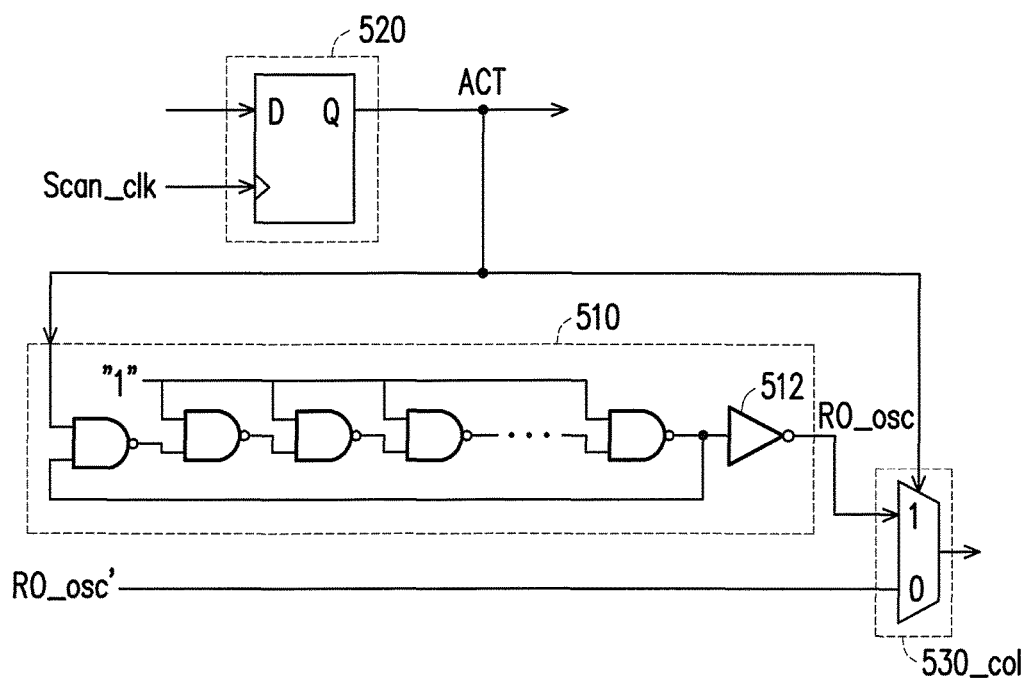
FIG. 6 illustrates a schematic circuit diagram of the sensor circuit in the embodiment of FIG. 3.

FIG. 6 illustrates a schematic circuit diagram of the sensor circuit in the embodiment of FIG. 3. Referring to FIG. 3 to FIG. 6, the sensor circuit 500 of the present exemplary embodiment includes an oscillator circuit 510, the register circuit 520 and the selector circuit 530_col. In present exemplary embodiment, the oscillator circuit 510 of the selected sensor circuit 500 outputs the oscillation signal RO_osc as the sensing signal RO_clk. In the present exemplary embodiment, when an input terminal D of the register circuit 520 receives the digital value "1" transferred by the scan chain 610, an output terminal Q of the register circuit 520 outputs an action signal ACT (having the digital value "1") to the oscillator circuit 510 for controlling the oscillator circuit 510 to generate the oscillation signal RO_osc as the sensing signal RO_clk. In addition, the action signal ACT outputted by the register circuit 520 is also transferred via the output terminal Q to a register circuit of a next-stage sensor circuit. In the present exemplary embodiment, the register circuit 520 generates and provides the action signal ACT to the oscillator circuit 510 according to an action signal and a scan clock signal Scan clk outputted by a previous-stage sensor circuit. After the action signal ACT having the digital value "1" is received by the oscillator circuit 510, the oscillator circuit starts to oscillate thereby generating the oscillation signal RO_osc. In this case, the selector circuit 530_col outputs the oscillation signal ACT to the signal measuring circuit 316 according to the action signal ACT. In the present exemplary embodiment, when the action signal ACT having a digital value "0" is outputted from the output terminal Q of the register circuit 520, what outputted by the selector circuit 530_col is an oscillation signal RO_osc' generated by the sensor circuit (which is currently sensing) from the previous-stage. In other words, in the present exemplary embodiment, when the action signal ACT=1, the sensing signal RO_clk outputted by the observing point monitoring circuit 312 is the oscillation signal RO_osc outputted by the oscillator circuit 510 of the current stage. When the action signal ACT=0, the sensing signal RO_clk outputted by the observing point monitoring circuit 312 is the oscillation signal RO_osc' outputted by a previous-stage oscillator circuit with respect to the oscillator circuit 510.

Therefore, in the present exemplary embodiment, the selector circuit 530_col selects one of the oscillation signal RO_osc generated by the oscillator circuit 510 and the oscillation signal RO_osc' outputted by the previous-stage sensor circuit to be outputted to the next-stage sensor circuit and the signal measuring circuit 316 according to the action signal ACT. Further, in the present exemplary embodiment, the oscillator circuit 510 includes an inverter circuit 512, which is coupled to an output terminal of the oscillator circuit 510 so that the output terminal of the oscillator circuits 510 of each sensor circuit during oscillation can have the same equivalent load for reducing errors on the oscillation periods of the oscillator circuits 510 at the different observing points due to different loads.

In the present exemplary embodiment, an internal circuit structure of the sensor circuit 500 is illustrative rather than limitations to the disclosure. Furthermore, in the present exemplary embodiment, a target analyzed by the signal measuring circuit 316 is the oscillation period of the oscillation signal RO_osc, but the disclosure is not limited thereto. In one exemplary embodiment, what analyzed by the signal measuring circuit 316 may also be an electrical characteristic of the sensing signal in other types, which are not particularly limited by the disclosure.

Referring to back to FIG. 3 and FIG. 4, in the present exemplary embodiment, the oscillation signal RO_osc is transferred to the signal measuring circuit 316. The signal measuring circuit 316 includes a quantifier circuit 311 and a counter circuit 313. The quantifier circuit 311 receives the oscillation signal RO_osc and analyzes the oscillation period of the oscillation signal RO_osc to obtain the maximum oscillation period of the oscillation signal RO_osc. Next, the quantifier circuit 311 converts the maximum oscillation period of the oscillation signal RO_osc into a first output digital code C1 to be outputted to the electronic device 320. Therefore, in the present exemplary embodiment, the analyzed result of the oscillation period includes the first output digital code C1. In a different monitoring period, the system control circuit 314 will use a reset signal S4 to reset the operation of the quantifier circuit 311. In the present exemplary embodiment, the phase-locked loop circuit 318 is configured to output a plurality of calibration signals to the quantifier circuit 311 to generate a plurality of calibration digital codes. For instance, the phase-locked loop circuit 318 outputs a first calibration signal S1 and a second calibration signal S2 to the quantifier circuit 311. The quantifier circuit 311 then generates calibration digital codes $\pi 1$ and $\pi 2$ accordingly. Next, the quantifier circuit 311 outputs the calibration digital codes $\pi 1$ and $\pi 2$ to the electronic device 320, so that the electronic device 320 can calculate the maximum oscillation period of the oscillation signal RO_osc according to the calibration digital codes $\pi 1$ and $\pi 2$.

For instance, after the maximum oscillation period of the oscillation signal RO_osc is converted into the first output digital code C1 by the quantifier circuit 311, the electronic device 320 can calculate the maximum oscillation period according to the first output digital code C1. In the present exemplary embodiment, the quantifier circuit 311 is calibrated by the first calibration signal S1 and the second calibration signal S2 to serve as a reference for calculating the maximum oscillation period by the electronic device 320. In the present exemplary embodiment, a width of the oscillation period of the oscillation signal RO_osc inputted to the quantifier circuit 311 has a predetermined linear relation with the first output digital code C1 obtained after the conversion. Therefore, the phase-locked loop circuit 318 can generate the first calibration signal S1 having a first period and the second calibration signal S2 having a second period to be outputted the quantifier circuit 311, respectively, so as to generate the calibration digital codes $\pi 1$ and $\pi 2$ for the calibration. In the present exemplary embodiment, the first period and the second period are 1000 picoseconds and 2000 picoseconds respectively, but the disclosure is not limited thereto. Next, after the first output digital code C1 is received by the electronic device 320, the maximum oscillation period corresponding to the first output digital code C1 may be calculated by a linear interpolation or a linear extrapolation and a calculation formula is provided as follows:

$$T\max(C1) = 1000 + (C1 - \pi 1) \times \left(\frac{1000}{\pi 2 - \pi 1}\right)$$

Herein, Tmax(C1) is the maximum oscillation period corresponding to the first output digital code C1, and a unit thereof is picoseconds. In the present exemplary embodiment, the above calculation formula and the values of the first period and the second period are illustrative rather than limitations to the disclosure. The system control circuit 314 outputs a calibration control signal S3 to the phase-locked loop circuit 318 to adjust signal periods (i.e., the values of the first period and the second period) of the first calibration signal S1 and the second calibration signal S2 outputted by the phase-locked loop circuit 318.

In the present exemplary embodiment, the counter circuit 313 receives the oscillation signal RO_osc and analyzes the oscillation period of the oscillation signal RO_osc to obtain the average oscillation period of the oscillation signal RO_osc. Further, the counter circuit 313 converts the average oscillation period of the oscillation signal RO_osc into a second output digital code C2 to be outputted to the electronic device 320. Therefore, in the present exemplary embodiment, the analyzed result of the oscillation period includes the second output digital code C2. In the present exemplary embodiment, the electronic device 320 divides a monitoring time of each observing point by a count counted by the counter circuit 313, so as to obtain the average oscillation period of the oscillation signal RO_osc in the monitoring time. In the present exemplary embodiment, the system control circuit 314 uses a reset signal S5 to reset the operation of the counter circuit 313. A method used by the electronic device 320 for calculating the average oscillation period of the oscillation signal RO_osc according to the calibration digital codes $\pi n$ and $\pi 2$ may refer to the foregoing embodiment for calculating the maximum oscillation period, which is not repeated hereinafter.

In the present exemplary embodiment, the system control circuit 314 includes, for example, Central Processing Unit (CPU), Microprocessor, Digital Signal Processor (DSP), Programmable Controller, Programmable Logic Device (PLD), or other similar devices, a combination of the said devices, which are not particularly limited by the disclosure. In the present exemplary embodiment, the quantifier circuit 311, the counter circuit 313 and the phase-locked loop circuit 318 may be respectively implemented by using any quantifier circuit, the counter circuit and the phase-locked loop circuit in the related art, which are not particularly limited by the disclosure. Therefore, enough teaching, suggestion, and implementation illustration for internal circuit structures and implementations of the quantifier circuit 311, the counter circuit 313 and the phase-locked loop circuit 318 may be obtained with reference to common knowledge in the related art, which are not repeated hereinafter.

Figure 7:
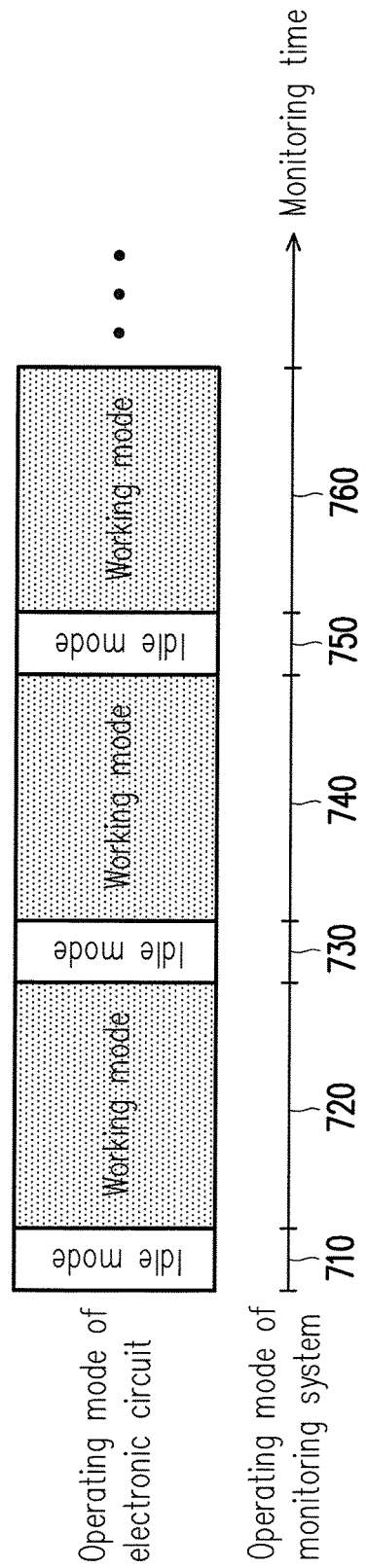
FIG. 7 is a schematic diagram illustrating an electronic circuit and an operation method of a monitoring system thereof in one exemplary embodiment of the disclosure.

FIG. 7 is a schematic diagram illustrating an electronic circuit and an operation method of a monitoring system thereof in one exemplary embodiment of the disclosure, which includes switching between an idle mode and a working mode. Referring to FIG. 3 and FIG. 7, in the present exemplary embodiment, the system 300 for monitoring electronic circuit separates effects from the circuit parameters of the observing points inside the electronic circuit 400 by monitoring in multiple modes. For instance, the electronic circuit 400 of the present exemplary embodiment is sequentially operated in the idle mode and the working mode in the monitoring period. In the idle mode, since the power voltage is not yet provided to the electronic circuit 400 at the time, the monitoring result obtained from monitoring the electronic circuit 400 by the electronic circuit monitoring device 310 during this period includes an influence caused by the process variation or the operating temperature on the electronic circuit 400. In the working mode, since the power voltage is provided to the electronic circuit 400 at the time, the monitoring result obtained from monitoring the electronic circuit 400 by the electronic circuit monitoring device 310 during this period includes an influence caused by the power voltage on the electronic circuit 400.

In the present exemplary embodiment, whether the observing point monitoring circuit 312 is operated in a first monitoring mode or a second monitoring mode is determined according to a mode control signal S6. In the present exemplary embodiment, the mode control signal S6 is outputted to the observing point monitoring circuit 312 by a circuit element in the electronic circuit 400, or outputted to the observing point monitoring circuit 312 by the electronic device 320 according to an operating mode of the electronic circuit 400. In the present exemplary embodiment, when the electronic circuit 400 is in the idle mode, the observing point monitoring circuit 312 is operated in the first monitoring mode (710, 730, 750). In this case, the signal measuring circuit 316 analyzes the oscillation period of the oscillation signal RO_osc to obtain the monitoring result of the process variation or the operating temperature. Therefore, in the present exemplary embodiment, when the observing point monitoring circuit 312 is operated in the first monitoring mode, the signal measuring circuit 316 analyzes the electrical characteristic of the sensing signal RO_clk to obtain the monitoring result of the operating temperature or the process variation of the electronic circuit 400. For instance, when the observing point monitoring circuit 312 is operated in the first monitoring mode 710 for the first time, it indicates that a power voltage of the electronic circuit 400 is just turned on and still in the idle mode without being operated yet. Therefore, in the first monitoring mode 710, in the first digital code C1 obtained from analyzing the oscillation period of the oscillation signal RO_osc by the signal measuring circuit, the influence caused by the power voltage may be ignored, and the operating temperature monitored at the time is known (e.g., as the room temperature). Accordingly, in this case, the monitoring result obtained from analyzing the oscillation period of the oscillation signal RO_osc by the signal measuring circuit 316 is related to the influence caused by the process variation on the electronic circuit 400. Therefore, in the present exemplary embodiment, after the electronic circuit 400 is in the idle mode for a predetermined time length, when the observing point monitoring circuit 312 is operated in the first monitoring mode for the first time, the signal measuring circuit 316 analyzes the electrical characteristic of the sensing signal RO_clk to obtain the monitoring result of the operating temperature or the process variation of the electronic circuit 400.

Next, when the observing point monitoring circuit 312 is operated in the first monitoring mode 730, the electronic circuit 400 returns back to the idle mode after being operated for a period of time. In the first monitoring mode 730, in the first digital code C1 obtained from analyzing the oscillation period of the oscillation signal RO_osc by the signal measuring circuit 316, the influence caused the power voltage may be ignored, and the influence caused by the process variation on the electronic circuit 400 is known according the monitoring result from the first monitoring mode 710. Accordingly, besides knowing that the monitoring result obtained from analyzing the oscillation period of the oscillation signal RO_osc by the signal measuring circuit 316 is related to the influence caused by the operating temperature on the electronic circuit 400, the operating temperature of the electronic circuit 400 at the time may also be calculated. A monitoring method used by the observing point monitoring circuit 312 operated in the first monitoring mode 750 may also be deduced by the same analogy, which is not repeated hereinafter.

Next, when the electronic circuit 400 is in the working mode in which the power voltage is provided to the electronic circuit 400, the observing point monitoring circuit 312 is operated in the second monitoring mode (720, 740, 760). In this case, the signal measuring circuit 316 analyzes the oscillation period of the oscillation signal RO_osc to obtain the monitoring result of the power voltage. Therefore, in the present exemplary embodiment, when the observing point monitoring circuit 312 is operated in the second monitoring mode, the signal measuring circuit 316 analyzes the electrical characteristic of the sensing signal RO_clk to obtain the monitoring result of the power voltage of the electronic circuit 400. For instance, when the observing point monitoring circuit 312 is operated in the second monitoring mode 720, the influence caused by the process variation on the electronic circuit 400 is known according to the monitoring result from the first monitoring mode 710 and the operating temperature monitored at the time is also known (e.g., as the room temperature identical to that of the first monitoring mode 710). Accordingly, besides knowing that the monitoring result obtained from analyzing the oscillation period of the oscillation signal RO_osc by the signal measuring circuit 316 is related to the influence caused by the power voltage on the electronic circuit 400, the maximum power voltage drop at the time may also be calculated. The operating temperature of the observing point monitoring circuit 312 operated in the second monitoring mode 740 is predetermined to be identical to that obtained from the calculation in the first monitoring mode 730. Accordingly, besides that the process variation and the operating temperature are known and the monitoring result obtained from analyzing the oscillation period of the oscillation signal RO_osc by the signal measuring circuit 316 is related to the influence caused by the power voltage on the electronic circuit 400, the maximum power voltage drop at the time may also be calculated. A monitoring method used by the observing point monitoring circuit 312 operated in the second monitoring mode 760 may also be deduced by the same analogy, which is not repeated hereinafter.

Therefore, according to the above method for monitoring in multiple modes, the system 300 for monitoring electronic circuit is operated in different monitoring modes in correspondence to an operating state of the electronic circuit 400, so that the effects of the circuit parameters (e.g., the power voltage, the process variation and the operating temperature) of the observing points inside the electronic circuit 400 may be separated and monitored individually.

Description regarding how the electronic device obtains the circuit parameters (e.g., the power voltage, the operating temperature and the oscillation period) according to the analyzed result of the oscillation period is provided as follows.

Figure 8:
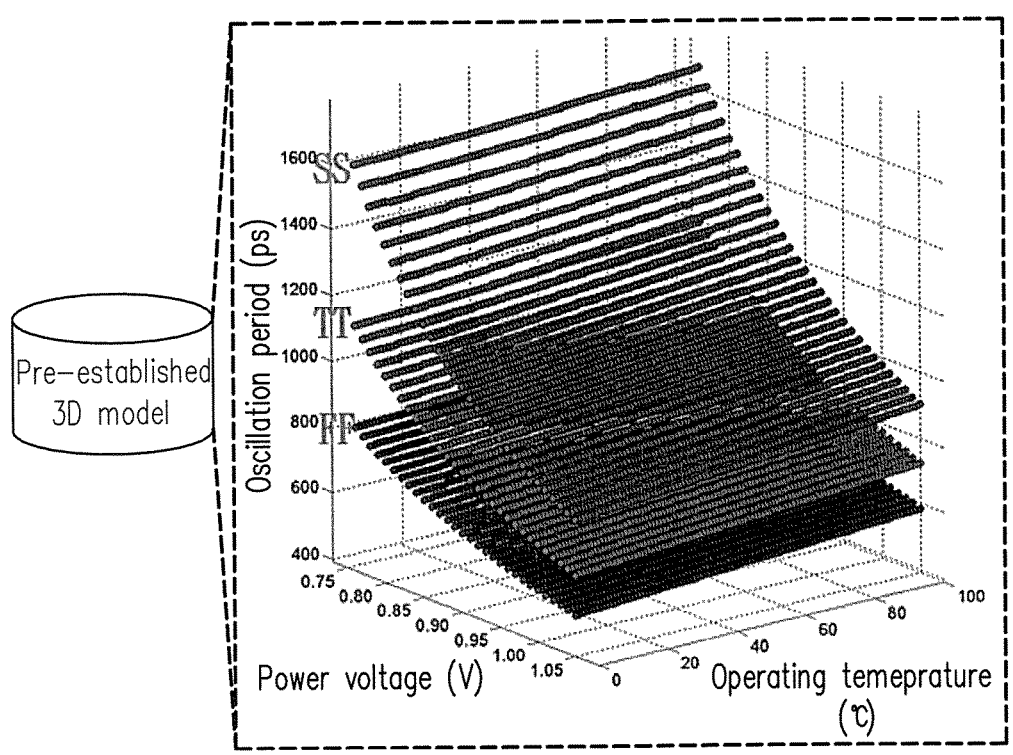
FIG. 8 is a schematic diagram illustrating a pre-established 3D model in one exemplary embodiment of the disclosure.

FIG. 8 is a schematic diagram illustrating a pre-established 3D model in one exemplary embodiment of the disclosure. Referring to FIG. 3 and FIG. 8, the electronic device 320 pre-establishes a 3D model depicted in FIG. 8 according to the circuit parameters (e.g., the process variation, the operating temperature and the power voltage) of the electronic circuit 400 by simulation or measurement. In other words, the 3D model is pre-established according to the process variation, the power voltage and the operating temperature of the electronic circuit by simulation or measurement. The 3D model includes a correspondence relationship among the power voltage, the operating temperature and the oscillation period of the electronic circuit 400. Also, in FIG. 8, the 3D model displays parameter points of the circuit parameters by simulation or measurement with different process parameters from top down. In the present exemplary embodiment, three process parameters SS, TT and FF are used for example. In the present exemplary embodiment, the signal measuring circuit 316 outputs the analyzed result of the oscillation period to the electronic device 320. The electronic device 320 obtains the monitoring result of the one or more circuit parameters according to the 3D model and the analyzed result of the oscillation period. The signal measuring circuit 316 outputs the analyzed result of the oscillation period (e.g., which includes the first output digital code C1 and the second output digital code C2) to the electronic device 320, so that the electronic device 320 can obtain the monitoring result of the circuit parameters (e.g., the process variation, the operating temperature and the power voltage) according to the pre-established 3D model and the analyzed result of the oscillation period. In the present exemplary embodiment, the electronic device 320 is a host system with similar functions like value calculation function or value mapping function, but the disclosure is not intended to limit a type of the electronic device 320 to the above.

Figure 9:
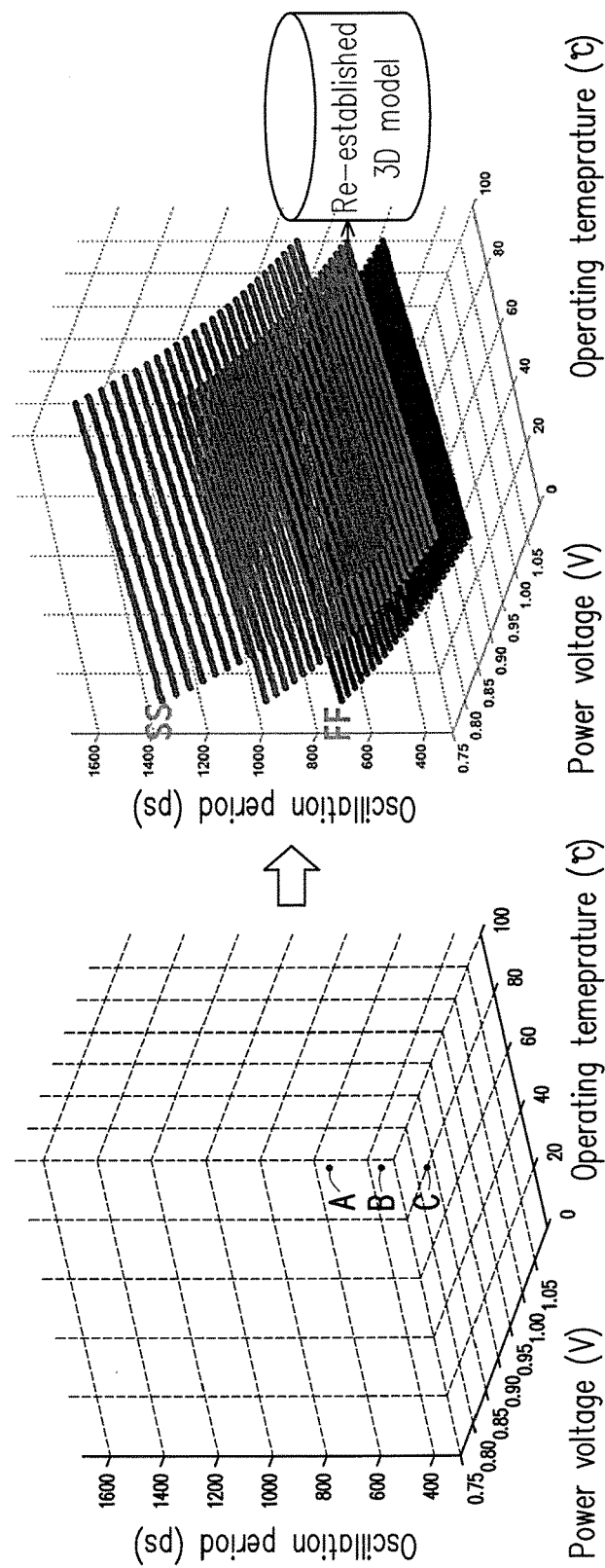
FIG. 9 is a schematic diagram illustrating a re-established 3D model in one exemplary embodiment of the disclosure.

In the present exemplary embodiment, before the power voltage and the operating temperature of the electronic circuit 400 is monitored by the electronic circuit monitoring device 310, the electronic device 320 will first re-establish the 3D model of FIG. 8 according to the monitoring result of the process variation. FIG. 9 is a schematic diagram illustrating a re-established 3D model in one exemplary embodiment of the disclosure. Referring to FIG. 7 and FIG. 9, in the present exemplary embodiment, when the observing point monitoring circuit 312 is operated in the first monitoring mode 710 for the first time, in view of the first digital code C1, the influence caused by the power voltage may be ignored, (which is assumed to be an ideal voltage) and the operating temperature monitored at the time is, for example, the room temperature. Accordingly, in this case, the monitoring result obtained by the electronic device 320 is corresponding to a calibration point B in FIG. 9. Next, the electronic device 320 then obtains another two corresponding parameter points A and C having the same power voltages and the same operating temperature of the calibration point B from the pre-established 3D model in FIG. 8. Herein, the parameter points A and C are the parameter points obtained by simulation or measurement in the SS and FF modes, respectively. The electronic device 320 calculates a scale coefficient γ of the process variation according to the calibration point B and the parameter points A and C. In the present exemplary embodiment, one of methods used by the electronic device 320 for calculating the scale coefficient γ includes: based on the parameter point C, calculating a period difference TB-TC between the calibration point B and parameter point C and a period difference TA-TC between the parameter point A and the parameter point C. The scale coefficient γ of the process variation is a ratio of said two differences, and a calculation formula thereof is shown as follows:

$$\gamma = \frac{TB - TC}{TA - TC}$$

Herein, γ is the scale coefficient, and TA, TB and TC are the oscillation periods respectively corresponding to the parameter point A, the calibration point B and the parameter point C. Next, the electronic device 320 re-establishes the 3D model according to the scale coefficient γ. Accordingly, in the present exemplary embodiment, the 3D model is further re-established according to the monitoring result of the process variation obtained from monitoring the electronic circuit. What illustrated in FIG. 9 is the 3D model re-established by the electronic device 320 according to the scale coefficient γ and each of the parameter points in the SS and FF modes. In FIG. 9, each of the parameter points in the TT mode has been re-established according to the scale coefficient γ and the SS and FF modes. One of methods used by the electronic device 320 for re-establishing each of the parameter points corresponding to the TT mode according to the scale coefficient γ and each of the parameter points in the SS and FF modes includes: linearly interpolating for each of the parameter points corresponding to the TT mode according to the scale coefficient γ and each of the parameter points in the SS and FF modes. A formula of the linear interpolation of the above is provided as follows:

$$TTT=(TSS-TFF)\times\gamma+TFF$$

Herein, γ is the scale coefficient; TSS and TFF are the oscillation periods respectively corresponding to the parameter points in the SS and FF modes; and TTT is the oscillation period obtained from linearly interpolating for each of the parameter points corresponding to the TT mode. Next, the electronic device 320 obtains the monitoring result of the circuit parameters (i.e., the operating temperature and the power voltage) according to the re-established 3D model and the analyzed result of the oscillation period.

Figure 10:
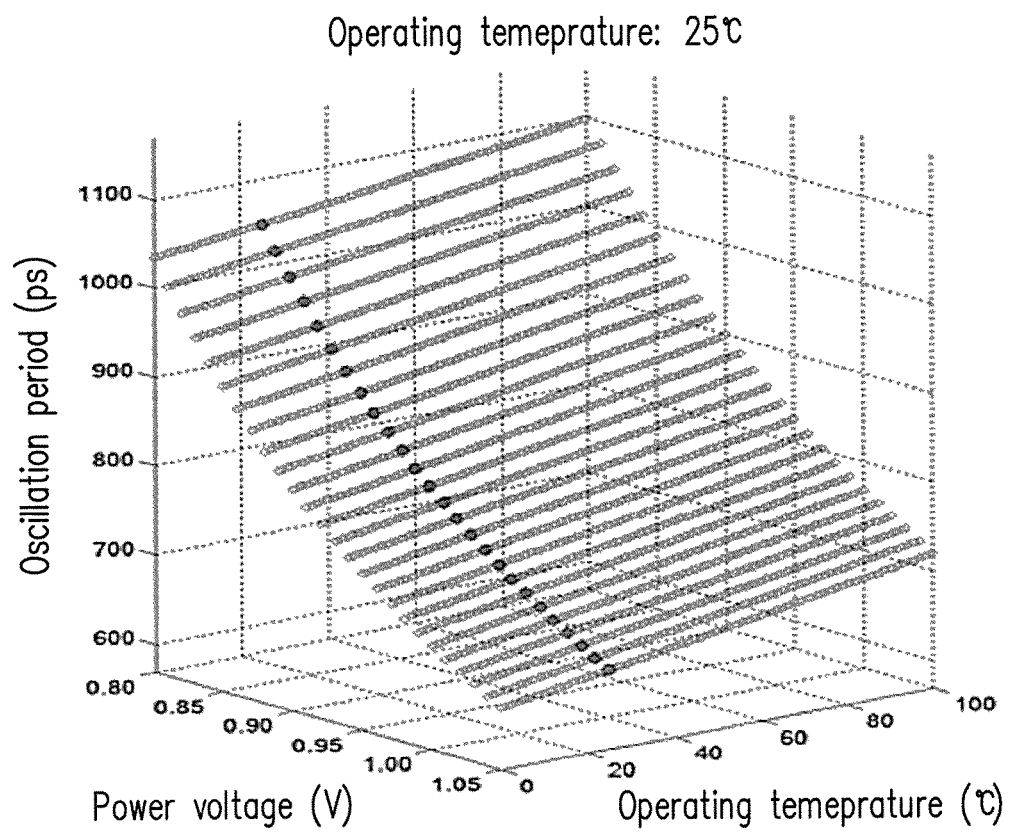
FIG. 10 is a schematic diagram illustrating the monitoring result obtained according to the re-established 3D model in one exemplary embodiment of the disclosure.

FIG. 10 is a schematic diagram illustrating the monitoring result obtained according to the re-established 3D model in one exemplary embodiment of the disclosure. Referring to FIG. 3, FIG. 7 and FIG. 10, FIG. 10 illustrates one exemplary embodiment of a power voltage prediction. Taking the second monitoring mode 720 for example, the influences caused by the process variation and the operating temperature on the electronic circuit 400 are known, in which the operating temperature is, for example, the room temperature (e.g., which is assumed to be 25° C.). Accordingly, after obtaining the first digital code C1 or the second digital code C2, the maximum oscillation period or the average oscillation period corresponding thereto may be calculated by the electronic device 320. Next, according to the maximum oscillation period or the average oscillation period, the electronic device 320 may map the power voltage corresponding to the maximum oscillation period or the average oscillation period from a plurality of parameter points corresponding to the operating temperature 25° C. in FIG. 10, so as to obtain the monitoring result of the maximum power voltage drop. Further, the monitoring results of the second monitoring modes 740 and 760 may also be deduced by the same analogy, which is not repeated hereinafter.

Figure 11:
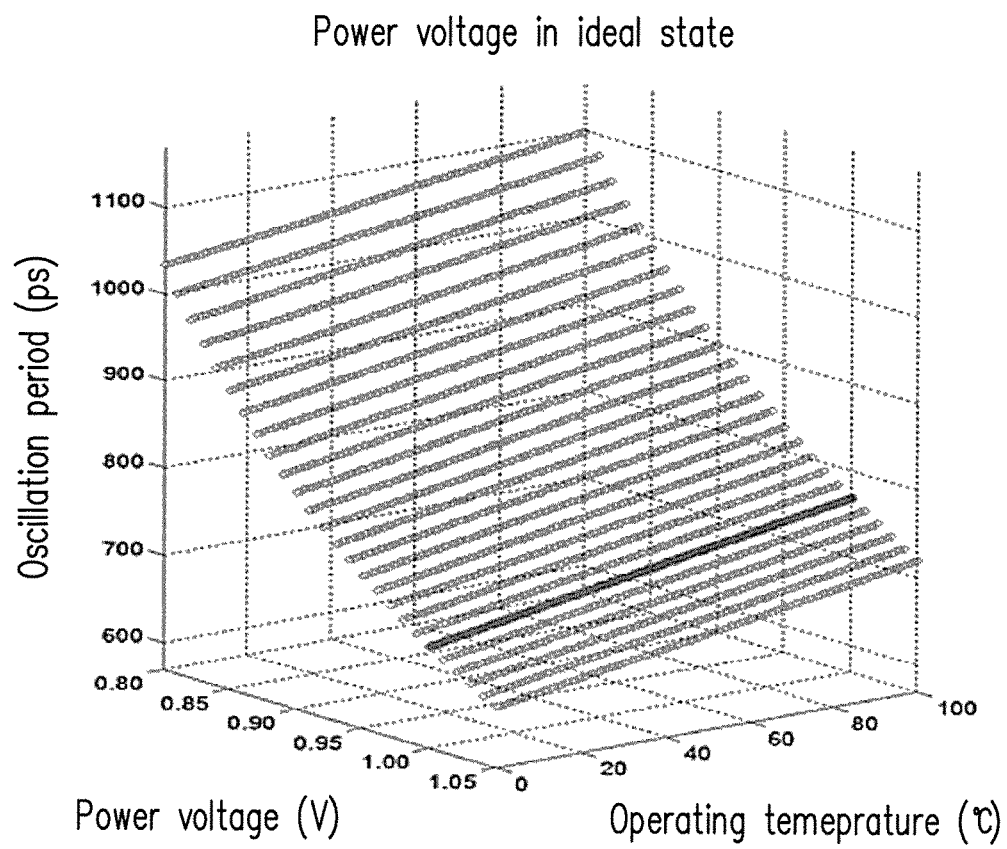
FIG. 11 is a schematic diagram illustrating the monitoring result obtained according to the re-established 3D model in one exemplary embodiment of the disclosure.

FIG. 11 is a schematic diagram illustrating the monitoring result obtained according to the re-established 3D model in one exemplary embodiment of the disclosure. Referring to FIG. 3, FIG. 7 and FIG. 11, FIG. 11 illustrates the exemplary embodiment of an operating temperature prediction. Taking the first monitoring mode 730 for example, in which the influences caused by the process variation and the power voltage on the electronic circuit 400 are known, in which the power voltage is assumed to be the ideal voltage (i.e., the power voltage is not yet provided to the electronic circuit 400 at this time). Accordingly, after obtaining the first digital code C1 or the second digital code C2, the maximum oscillation period or the average oscillation period corresponding thereto may be calculated by the electronic device 320. Next, according to the maximum oscillation period or the average oscillation period, the electronic device 320 may map the operating temperature corresponding to the maximum oscillation period or the average oscillation period from a plurality of parameter points corresponding to the ideal voltage in FIG. 11, so as to obtain the monitoring result of the operating temperature. Further, the monitoring result of the first monitoring mode 750 may also be deduced by the same analogy, which is not repeated hereinafter.

Figure 12:
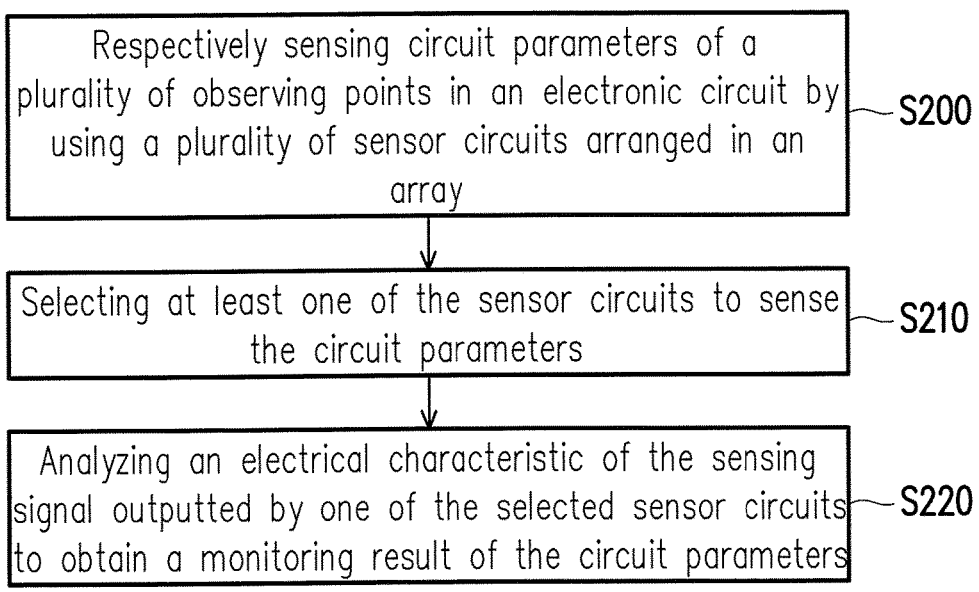
FIG. 12 is a flowchart illustrating steps of a method for monitoring electronic circuit in one exemplary embodiment of the disclosure.

FIG. 12 is a flowchart illustrating steps of a method for monitoring electronic circuit in one exemplary embodiment of the disclosure. Referring to FIG. 3 to FIG. 6 and FIG. 12, the method for monitoring electronic circuit is at least adapted to the system for monitoring electronic circuit in FIG. 3 to FIG. 6, but the disclosure is not limited thereto. The method for monitoring electronic circuit at least includes the following steps. In step S200, the system 300 for monitoring electronic circuit uses a plurality of sensor circuits 500 arranged in an array to respectively sense circuit parameters of observing points in the electronic circuit 400. Next, in step S210, the system 300 for monitoring electronic circuit selects at least one of the sensor circuits 500 to sense the circuit parameters. Thereafter, in step S220, the system 300 for monitoring electronic circuit analyzes the electrical characteristic of the sensing signal RO_clk outputted by the selected sensor circuit 500 to obtain a monitoring result of the circuit parameters.

In addition, enough teaching, suggestion, and implementation illustration regarding the method for monitoring electronic circuit may be obtained from the above embodiments depicted in FIG. 1 to FIG. 11, which are not repeated hereinafter.

Figure 13A:
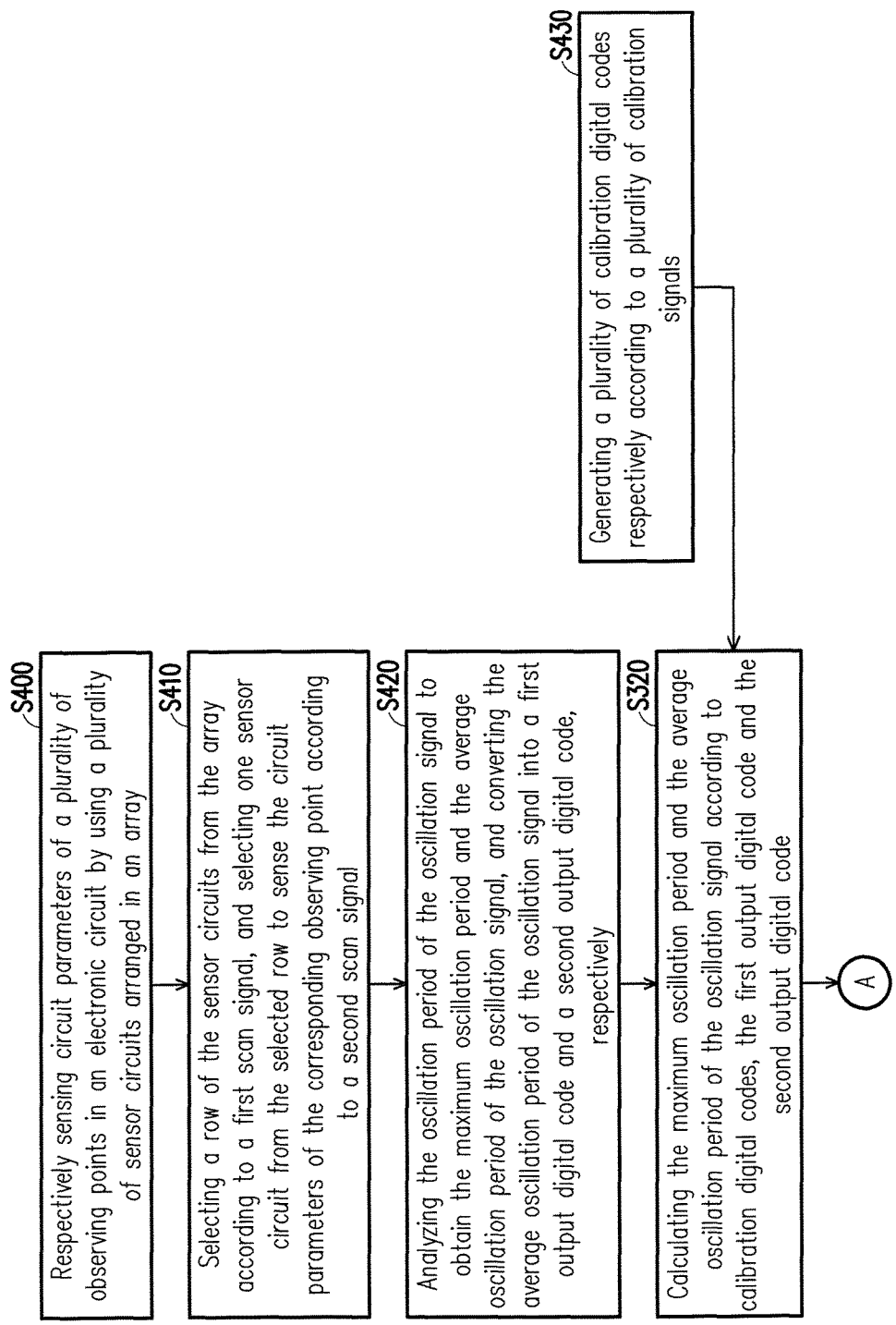
FIG. 13A and FIG. 13B are a flowchart illustrating steps of a method for monitoring electronic circuit in another exemplary embodiment of the disclosure.
Figure 13B:
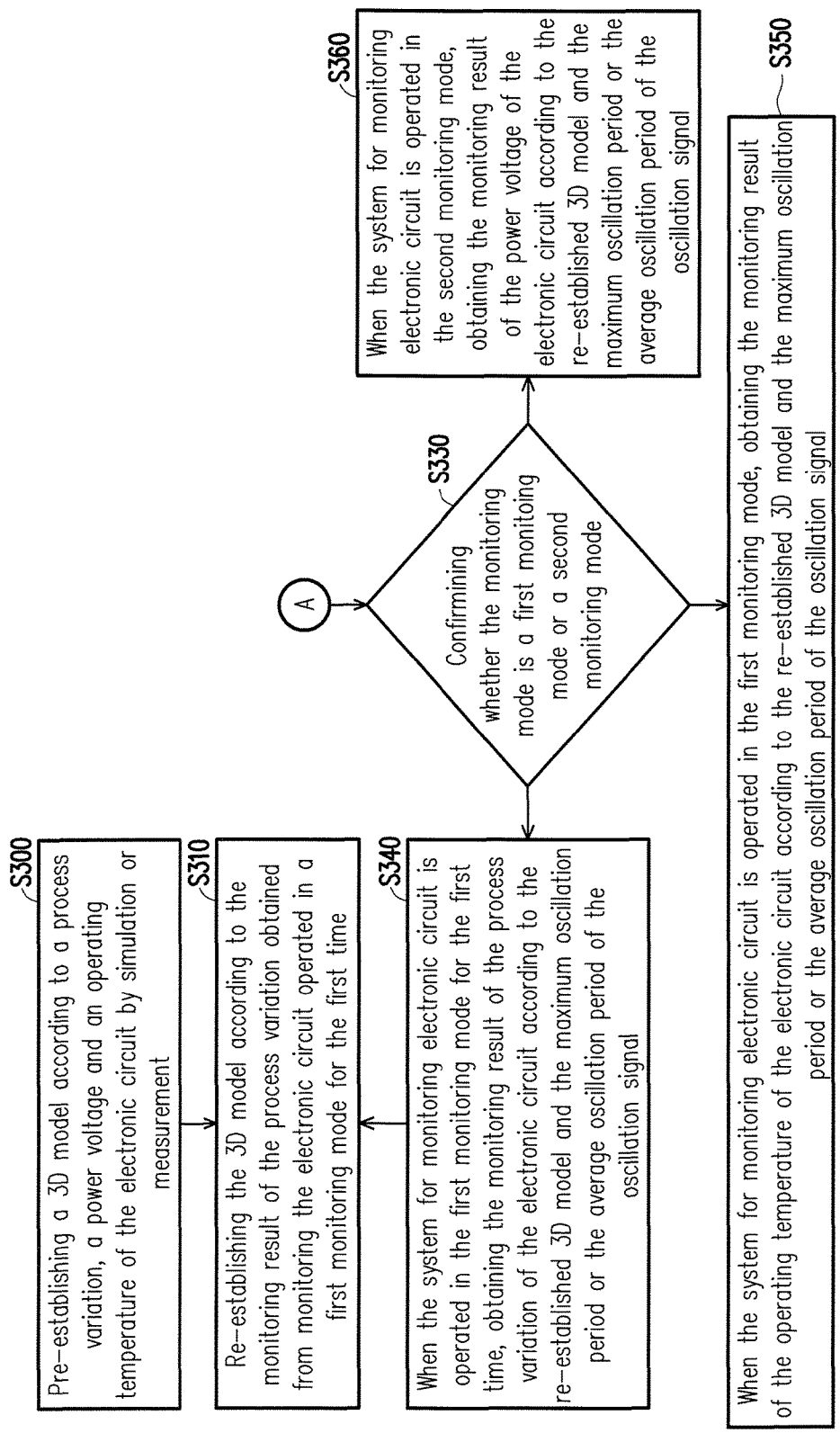

FIG. 13A and FIG. 13B are a flowchart illustrating steps of a method for monitoring electronic circuit in another exemplary embodiment of the disclosure. Referring to FIG. 3 to FIG. 6, FIG. 13A and FIG. 13B, the method for monitoring electronic circuit is at least adapted to the system for monitoring electronic circuit in FIG. 3 to FIG. 6, but the disclosure is not limited thereto. The method for monitoring electronic circuit at least includes the following steps. In step S300, the system 300 for monitoring electronic circuit pre-establishes a 3D model according to the circuit parameters (e.g., the process variation, the power voltage and the operating temperature) of the electronic circuit 400 by simulation or measurement. Next, in step S310, the system 300 for monitoring electronic circuit re-establishes the 3D model according to the monitoring result of the process variation obtained from monitoring the electronic circuit 400 operated in the first monitoring mode for the first time.

In step S400, the system 300 for monitoring electronic circuit uses a plurality of sensor circuits 500 arranged in an array to respectively sense circuit parameters of observing points in the electronic circuit 400. Next, in step S410, the system 300 for monitoring electronic circuit selects one row from the array according to the first scan signal S1 and selects one sensor circuit 500 from the selected row according to the second scan signal to sense the circuit parameters of the corresponding observing point. Thereafter, in step S420, the system 300 for monitoring electronic circuit analyzes the oscillation period of the oscillation signal RO_osc to obtain the maximum oscillation period and the average oscillation period, and converts the maximum oscillation period and the average oscillation period into the first output digital code C1 and the second output digital code C2 respectively. Further, in step S430, the system 300 for monitoring electronic circuit generates the calibration digital codes π1 and π2 according to the calibration signals S1 and S2, respectively.

Accordingly, in the present exemplary embodiment, in the step of analyzing the electrical characteristic of the circuit parameter, the monitoring result of the circuit parameters is obtained by analyzing the oscillation period of the oscillation signal. In the present exemplary embodiment, the analyzed result of the oscillation period includes at least one of the maximum oscillation period and the average oscillation period of the oscillation signal. In the present exemplary embodiment, the step of analyzing the electrical characteristic of the sensing signal to obtain the monitoring result of the circuit parameters further include: analyzing the oscillation period of the oscillation signal to obtain the maximum oscillation period of the oscillation signal; and converting the maximum oscillation period of the oscillation signal into a first output digital code. In the present exemplary embodiment, the step of analyzing the oscillation period of the oscillation signal to obtain the maximum oscillation period of the oscillation signal includes: generating a plurality of calibration digital codes respectively according to a plurality of calibration signals; and calculating the maximum oscillation period of the oscillation signal according to the calibration digital codes. In the present exemplary embodiment, the step of analyzing the electrical characteristic of the sensing signal to obtain the monitoring result of the circuit parameters further include: analyzing the oscillation period of the oscillation signal to obtain the average oscillation period of the oscillation signal; and converting the average oscillation period of the oscillation signal into a second output digital code. Further, in one embodiment, the method for monitoring electronic circuit further includes adjusting the signal periods of the calibration signals.

In step S320, the system 300 for monitoring electronic circuit calculates the maximum oscillation signal and the average oscillation signal of the oscillation signal RO_osc according to the calibration digital codes π1 and π2, and the first output digital code C1 and the second output digital code C2. Next, in step S330, the system 300 for monitoring electronic circuit confirms whether the monitoring mode is the first monitoring mode or the second monitoring mode. In step S340, when the system 300 for monitoring electronic circuit is operated in the first monitoring mode for the first time, the system 300 for monitoring electronic circuit obtains the monitoring result of the process variation of the electronic circuit 400 according to the re-established 3D model and the maximum oscillations period or the average oscillation period of the oscillation signal RO_osc. In step S350, when the system 300 for monitoring electronic circuit is operated in the first monitoring mode, the system 300 for monitoring electronic circuit obtains the monitoring result of the operating temperature of the electronic circuit 400 according to the re-established 3D model and the maximum oscillations period or the average oscillation period of the oscillation signal RO_osc. In step S360, when the system 300 for monitoring electronic circuit is in the second monitoring mode, the system 300 for monitoring electronic circuit obtains the monitoring result of the power voltage of the electronic circuit 400 according to the re-established 3D model and the maximum oscillations period or the average oscillation period of the oscillation signal RO_osc.

Therefore, in the present exemplary embodiment, the method for monitoring electronic circuit includes: obtaining the monitoring result of the circuit parameters according to the 3D model and the analyzed result of the oscillation period. In the present exemplary embodiment, the method for monitoring electronic circuit includes: pre-establishing the 3D model according to the process variation, the power voltage and the operating temperature of the electronic circuit by simulation or measurement. In the present exemplary embodiment, the method for monitoring electronic circuit includes: re-establishing the 3D model according to the monitoring result of the process variation obtained from monitoring the electronic circuit. In the present exemplary embodiment, the step of selecting one of the sensor circuits to sense the circuit parameters includes: according to the first scan signal, selecting a row of the sensor circuits from the array to sense the circuit parameters. The sensing signal is outputted from the selected row. In the present exemplary embodiment, the step of selecting one of the sensor circuits to sense the circuit parameters includes: according to the second scan signal, selecting one sensor circuit from the selected row to sense the circuit parameters of the corresponding observing point. In the present exemplary embodiment, the step of analyzing the electrical characteristic of the sensing signal to obtain the monitoring result of the circuit parameters further include: in the first monitoring mode, analyzing the electrical characteristic of the sensing signal to obtain the monitoring result of the operating temperature or the process variation of the electronic circuit; and in the second monitoring mode, analyzing the electrical characteristic of the sensing signal to obtain the monitoring result of the power voltage of the electronic circuit. In the present exemplary embodiment, after the electronic circuit is in the idle mode for the predetermined time length, the method for monitoring electronic circuit is operated in the first monitoring mode for the first time. In the first monitoring mode, the step of analyzing the electrical characteristic of the sensing signal to obtain the monitoring result of the operating temperature or the process variation of the electronic circuit further includes: when the method for monitoring electronic circuit is operated in the first monitoring mode for the first time, analyzing the electrical characteristic of the sensing signal to obtain the monitoring result of the process variation of the electronic circuit. In the present exemplary embodiment, whether the method for monitoring electronic circuit is operated in the first monitoring mode or the second monitoring mode is determined according to a mode control signal. In the present exemplary embodiment, when the electronic circuit is in the idle mode, the method for monitoring electronic circuit is operated in the first monitoring mode. When the electronic circuit is in the working mode, the method for monitoring electronic circuit is operated in the second monitoring mode.

In addition, enough teaching, suggestion, and implementation illustration regarding the method for monitoring electronic circuit may be obtained from the above embodiments depicted in FIG. 1 to FIG. 12, which are not repeated hereinafter.

To sum up, in the exemplary embodiments of the disclosure, the system and the method for monitoring electronic circuit are used to implant the sensor circuits inside the electronic circuit and to quantify the electrical characteristic of the sensing signal by the signal measuring circuit. Then, the system and the method for monitoring electronic circuit are used to eliminate the factor of the process variation by analysis of the 3D model to estimate the power voltage and the operating temperature according to the monitored electrical characteristic, so as to monitor the power voltage and the operating temperature in the operating period of the electronic circuit. Therefore, the system and the method for monitoring electronic circuit are capable of improving performance and reliability of the electronic circuit.

It will be apparent to those skilled in the art that various modifications and variations can be made to the disclosed embodiments. It is intended that the specification and examples be considered as exemplary only, with a true scope of the disclosure being indicated by the following claims and their equivalents

What is claimed is:

1. A system for monitoring electronic circuit, configured to monitor one or more circuit parameters of an electronic circuit, and comprising:

an observing point monitoring circuit, comprising a plurality of sensor circuits arranged in an array, which are configured to respectively sense the one or more circuit parameters of a plurality of observing points in the electronic circuit, wherein each of the sensor circuits comprises an oscillator circuit;

a system control circuit, coupled to the observing point monitoring circuit, and configured to select at least one of the sensor circuits to sense the one or more circuit parameters, wherein the oscillator circuit of one of the selected sensor circuits outputs an oscillation signal; and a signal measuring circuit, coupled to the observing point monitoring circuit, and configured to receive the oscillation signal and analyze an oscillation period of the oscillation signal to obtain a monitoring result of the one or more circuit parameters, wherein the signal measuring circuit comprises:
a quantifier circuit, coupled to the observing point monitoring circuit, and configured to analyze the oscillation period of the oscillation signal to obtain the maximum oscillation period of the oscillation signal, and convert the maximum oscillation period of the oscillation signal into a first output digital code to be outputted to an electronic device, wherein the analyzed result of the oscillation period comprises the first output digital code, wherein the electronic device obtains a calibration point for a pre-established model based on the first output digital code and corrects the pre-established model based on the calibration point, wherein the pre-established model is related to at least one parameter of the electronic circuit.

2. The system for monitoring electronic circuit of claim 1, wherein each of the sensor circuits further comprises:

a register circuit, coupled to the oscillator circuit, and configured to output an action signal for controlling the oscillator circuit to generate the oscillation signal, wherein the register circuit generates the action signal according to an action signal and a scan clock signal outputted by a previous-stage sensor circuit; and a selector circuit, coupled to the oscillator circuit, the register circuit and the previous-stage sensor circuit, and configured to select one of the oscillation signal generated by the oscillator circuit and an oscillation signal outputted by the previous-stage sensor circuit to be outputted to a next-stage sensor circuit and the signal measuring circuit according to the action signal.

3. The system for monitoring electronic circuit of claim 1, further comprising:
a phase-locked loop circuit, coupled to the system control circuit, and configured to output a plurality of calibration signals to the quantifier circuit, wherein the quantifier circuit generates a plurality of calibration digital codes respectively according to the calibration signals and outputs the calibration digital codes to the electronic device, and the electronic device calculates the maximum oscillation period of the oscillation signal according to the calibration digital codes.

4. The system for monitoring electronic circuit of claim 3, wherein the system control circuit outputs a calibration control signal to the phase-locked loop circuit to adjust signal periods of the calibration signals outputted by the phase-locked loop circuit.

5. The system for monitoring electronic circuit of claim 1, wherein the signal measuring circuit further comprises:
a counter circuit, coupled to the observing point monitoring circuit, and configured to analyze the oscillation period of the oscillation signal to obtain the average oscillation period of the oscillation signal, and convert the average oscillation period of the oscillation signal into a second output digital code to be outputted to the electronic device, wherein the analyzed result of the oscillation period comprises the second output digital code.

6. The system for monitoring electronic circuit of claim 1, further comprising the electronic device, wherein the signal measuring circuit outputs an analyzed result of the oscillation period to the electronic device, and the electronic device obtains the monitoring result of the one or more circuit parameters according to a 3D model and an analyzed result of the oscillation period, wherein the 3D model comprises a correspondence relationship among a power voltage, an operating temperature and the oscillation period of the electronic circuit.

7. The system for monitoring electronic circuit of claim 6, wherein the 3D model is pre-established according to a process variation, the power voltage and the operating temperature of the electronic circuit by simulation or measurement.

8. The system for monitoring electronic circuit of claim 7, wherein the 3D model is further re-established according to the monitoring result of the process variation obtained from monitoring the electronic circuit.

9. The system for monitoring electronic circuit of claim 1, wherein the system control circuit outputs a first scan signal to the observing point monitoring circuit to select a row of the sensor circuits from the array to sense the one or more circuit parameters, wherein the oscillation signal is outputted from the selected row.

10. The system for monitoring electronic circuit of claim 9, wherein the system control circuit further outputs a second scan signal to the observing point monitoring circuit to select one sensor circuit from the selected row to sense the one or more circuit parameters of the corresponding observing point.

11. The system for monitoring electronic circuit of claim 1, wherein whether the observing point monitoring circuit is operated in a first monitoring mode or a second monitoring mode is determined according to a mode control signal, wherein when the electronic circuit is in an idle mode, the observing point monitoring circuit is operated in the first monitoring mode, and when the electronic circuit is in a working mode, the observing point monitoring circuit is operated in the second monitoring mode.

12. The system for monitoring electronic circuit of claim 11, wherein the one or more circuit parameters comprises a power voltage, an operating temperature and a process variation, wherein when the observing point monitoring circuit is operated in the first monitoring mode, the signal measuring circuit analyzes oscillation signal to obtain the monitoring result of the operating temperature or the process variation of the electronic circuit, and when the observing point monitoring circuit is operated in the second monitoring mode, the signal measuring circuit analyzes the oscillation signal to obtain the monitoring result of the power voltage of the electronic circuit.

13. The system for monitoring electronic circuit of claim 12, wherein after the electronic circuit is in the idle mode for a predetermined time length, when the observing point monitoring circuit is operated in the first monitoring mode for the first time, the signal measuring circuit analyzes the oscillation signal to obtain the monitoring result of the process variation of the electronic circuit.

14. A method for monitoring electronic circuit, configured to monitor one or more circuit parameters of an electronic circuit, and comprising:
respectively sensing the one or more circuit parameters of a plurality of observing points in the electronic circuit by using a plurality of sensor circuits arranged in an array, wherein each of the sensor circuits comprises an oscillator circuit;
selecting at least one of the sensor circuits to sense the one or more circuit parameters, wherein the oscillator circuit of one of the selected sensor circuits outputs an oscillation signal; and
analyzing an oscillation period of the oscillation signal to obtain a monitoring result of the one or more circuit parameters, wherein the step of analyzing the oscillation period of the oscillation signal to obtain the monitoring result of the one or more circuit parameters comprises:
analyzing the oscillation period of the oscillation signal to obtain the maximum oscillation period of the oscillation signal; and
converting the maximum oscillation period of the oscillation signal into a first output digital code to be outputted to an electronic device, wherein the analyzed result of the oscillation period comprises the first output digital code,
wherein the electronic device obtains a calibration point for a pre-established model based on the first output digital code and corrects the pre-established model based on the calibration point, wherein the pre-established model is related to at least one parameter of the electronic circuit.

15. The method for monitoring electronic circuit of claim 14, wherein an analyzed result of the oscillation period comprises at least one of a maximum oscillation period and an average oscillation period of the oscillation signal.

16. The method for monitoring electronic circuit of claim 14, wherein the step of analyzing the oscillation period of the oscillation signal to obtain the maximum oscillation period of the oscillation signal further comprises:
generating a plurality of calibration digital codes respectively according to a plurality of calibration signals; and
calculating the maximum oscillation period of the oscillation signal according to the calibration digital codes.

17. The method for monitoring electronic circuit of claim 16, further comprising adjusting signal periods of the calibration signals.

18. The method for monitoring electronic circuit of claim 15, wherein the step of analyzing the oscillation period of the oscillation signal to obtain the monitoring result of the one or more circuit parameters further comprises:
analyzing the oscillation period of the oscillation signal to obtain the average oscillation period of the oscillation signal; and
converting the average oscillation period of the oscillation signal into a second output digital code, wherein the analyzed result of the oscillation period comprises the second output digital code.

19. The method for monitoring electronic circuit of claim 14, further comprising:
obtaining the monitoring result of the one or more circuit parameters according to a 3D model and an analyzed result of the oscillation period, wherein the 3D model comprises a correspondence relationship among a power voltage, an operating temperature and the oscillation period of the electronic circuit.

20. The method for monitoring electronic circuit of claim 19, further comprising:
pre-establishing the 3D model according to a process variation, the power voltage and the operating temperature of the electronic circuit by simulation or measurement.

21. The method for monitoring electronic circuit of claim 20, further comprising:
re-establishing the 3D model according to the monitoring result of the process variation obtained from monitoring the electronic circuit.

22. The method for monitoring electronic circuit of claim 14, wherein the step of selecting the at least one of the sensor circuits to sense the one or more circuit parameters further comprises:
according to a first scan signal, selecting a row of the sensor circuits from the array to sense the one or more circuit parameters, wherein the oscillation signal is outputted from the selected row.

23. The method for monitoring electronic circuit of claim 22, wherein the step of selecting the at least one of the sensor circuits to sense the one or more circuit parameters further comprises:
according to a second scan signal, selecting one sensor circuit from the selected row to sense the one or more circuit parameters of the corresponding observing point.

24. The method for monitoring electronic circuit of claim 14, wherein the one or more circuit parameters comprises a power voltage, an operating temperature and a process variation, and the step of analyzing the oscillation signal to obtain the monitoring result of the one or more circuit parameters further comprises:
in a first monitoring mode, analyzing the oscillation signal to obtain the monitoring result of the operating temperature or the process variation of the electronic circuit; and
in a second monitoring mode, analyzing the oscillation signal to obtain the monitoring result of the power voltage of the electronic circuit.

25. The method for monitoring electronic circuit of claim 24, wherein after the electronic circuit is in an idle mode for a predetermined time length, the method for monitoring electronic circuit is operated in the first monitoring mode for the first time, and in the first monitoring mode, the step of analyzing the oscillation signal to obtain the monitoring result of the operating temperature or the process variation of the electronic circuit further comprises:
when the method for monitoring electronic circuit is operated in the first monitoring mode for the first time, analyzing the oscillation signal to obtain the monitoring result of the process variation of the electronic circuit.

26. The method for monitoring electronic circuit of claim 25, wherein whether the method for monitoring electronic circuit is operated in the first monitoring mode or the second monitoring mode is determined according to a mode control signal.

27. The method for monitoring electronic circuit of claim 26, wherein when the electronic circuit is in the idle mode, the method for monitoring electronic circuit is operated in the first monitoring mode, and when the electronic circuit is in a working mode, the method for monitoring electronic circuit is operated in the second monitoring mode.

28. A system for monitoring electronic circuit, configured to monitor one or more circuit parameters of an electronic circuit, and comprising:
an observing point monitoring circuit, comprising a plurality of sensor circuits arranged in an array, which are configured to respectively sense the one or more circuit parameters of a plurality of observing points in the electronic circuit, wherein each of the sensor circuits comprises an oscillator circuit;
a system control circuit, coupled to the observing point monitoring circuit, and configured to select at least one of the sensor circuits to sense the one or more circuit parameters, wherein the oscillator circuit of one of the selected sensor circuits outputs an oscillation signal; and
a signal measuring circuit, coupled to the observing point monitoring circuit, and configured to receive the oscillation signal and analyze an oscillation period of the oscillation signal to obtain a monitoring result of the one or more circuit parameters,
wherein the signal measuring circuit comprises:
a counter circuit, coupled to the observing point monitoring circuit, and configured to analyze the oscillation period of the oscillation signal to obtain the average oscillation period of the oscillation signal, and convert the average oscillation period of the oscillation signal into a second output digital code to be outputted to an electronic device, wherein the analyzed result of the oscillation period comprises the second output digital code,
wherein the electronic device obtains a calibration point for a pre-established model based on the second output digital code and corrects the pre-established model based on the calibration point, wherein the pre-established model is related to at least one parameter of the electronic circuit.

29. A method for monitoring electronic circuit, configured to monitor one or more circuit parameters of an electronic circuit, and comprising:
respectively sensing the one or more circuit parameters of a plurality of observing points in the electronic circuit by using a plurality of sensor circuits arranged in an array, wherein each of the sensor circuits comprises an oscillator circuit;
selecting at least one of the sensor circuits to sense the one or more circuit parameters, wherein the oscillator circuit of one of the selected sensor circuits outputs an oscillation signal; and analyzing an oscillation period of the oscillation signal to obtain a monitoring result of the one or more circuit parameters, wherein the step of analyzing the oscillation period of the oscillation signal to obtain the monitoring result of the one or more circuit parameters comprises:
  analyzing the oscillation period of the oscillation signal to obtain the average oscillation period of the oscillation signal; and
  converting the average oscillation period of the oscillation signal into a second output digital code to be outputted to an electronic device, wherein the analyzed result of the oscillation period comprises the second output digital code,
wherein the electronic device obtains a calibration point for a pre-established model based on the second output digital code and corrects the pre-established model based on the calibration point, wherein the pre-established model is related to at least one parameter of the electronic circuit.

* * * * *